US010636767B2

(12) United States Patent
Haba

(10) Patent No.: US 10,636,767 B2
(45) Date of Patent: Apr. 28, 2020

(54) CORRECTION DIE FOR WAFER/DIE STACK

(71) Applicant: Invensas Corporation, San Jose, CA (US)

(72) Inventor: Belgacem Haba, Saratoga, CA (US)

(73) Assignee: Invensas Corporation, San Jose, CA (US)

( * ) Notice: Subject to any disclaimer, the term of this patent is extended or adjusted under 35 U.S.C. 154(b) by 914 days.

(21) Appl. No.: 15/057,083

(22) Filed: Feb. 29, 2016

(65) Prior Publication Data

US 2017/0250161 A1   Aug. 31, 2017

(51) Int. Cl.
*H01L 25/065* (2006.01)
*H01L 25/00* (2006.01)
*H01L 21/66* (2006.01)
*H01L 21/78* (2006.01)

(52) U.S. Cl.
CPC .......... *H01L 25/0657* (2013.01); *H01L 21/78* (2013.01); *H01L 22/20* (2013.01); *H01L 25/50* (2013.01); *H01L 2225/06513* (2013.01); *H01L 2225/06541* (2013.01); *H01L 2225/06593* (2013.01); *H01L 2225/06596* (2013.01)

(58) Field of Classification Search
CPC ..... H01L 25/0657; H01L 21/78; H01L 22/20; H01L 25/50; H01L 2225/06596; H01L 2225/06593; H01L 2225/06541; H01L 2225/06513
See application file for complete search history.

(56) References Cited

U.S. PATENT DOCUMENTS

| | | | | |
|---|---|---|---|---|
| 5,414,637 A | * | 5/1995 | Bertin | ..... H01L 22/22 257/723 |
| 5,698,895 A | * | 12/1997 | Pedersen | ..... H01L 22/22 257/665 |
| 8,327,225 B2 | | 12/2012 | Jeddeloh | |
| 8,677,216 B2 | | 3/2014 | Park et al. | |
| 8,935,594 B2 | | 1/2015 | Chen et al. | |
| 9,136,021 B2 | | 9/2015 | Yang et al. | |
| 9,153,517 B2 | * | 10/2015 | Co | ..... H01L 23/3185 |
| 9,300,298 B2 | | 3/2016 | Cordero et al. | |
| 2004/0245617 A1 | * | 12/2004 | Damberg | ..... H01L 25/0652 257/686 |
| 2005/0085034 A1 | * | 4/2005 | Akiba | ..... H01L 21/565 438/232 |
| 2007/0170584 A1 | * | 7/2007 | Chatterjee | ..... H01L 21/76885 257/734 |
| 2010/0075460 A1 | * | 3/2010 | Gu | ..... H01L 23/544 438/107 |

(Continued)

OTHER PUBLICATIONS

"High Bandwidth Memory," downloaded from the web at Wikipedia: https://en.wikipedia.org/wiki/High_Bandwidth_Memory, Mar. 17, 2016, 3 pages.

(Continued)

*Primary Examiner* — Charles D Garber
*Assistant Examiner* — S M Sohel Imtiaz

(57) ABSTRACT

Representative implementations of devices and techniques provide correction for a defective die in a wafer-to-wafer stack or a die stack. A correction die is coupled to a die of the stack with the defective die. The correction die electrically replaces the defective die. Optionally, a dummy die can be coupled to other die stacks of a wafer-to-wafer stack to adjust a height of the stacks.

14 Claims, 8 Drawing Sheets

(56) References Cited

U.S. PATENT DOCUMENTS

| | | | |
|---|---|---|---|
| 2010/0140811 A1* | 6/2010 | Leal | H01L 24/24 257/777 |
| 2011/0167319 A1 | 7/2011 | Jeddeloh | |
| 2011/0231735 A1 | 9/2011 | Park et al. | |
| 2012/0248624 A1* | 10/2012 | Endo | H01L 21/76898 257/774 |
| 2012/0273843 A1* | 11/2012 | Kim | H01L 27/105 257/209 |
| 2012/0313259 A1* | 12/2012 | Sasaki | H01L 25/0657 257/777 |
| 2013/0119542 A1* | 5/2013 | Oh | H01L 25/0657 257/738 |
| 2013/0234339 A1* | 9/2013 | Higashi | H01L 21/82 257/774 |
| 2013/0275823 A1 | 10/2013 | Cordero et al. | |
| 2014/0179061 A1* | 6/2014 | Haba | H01L 21/56 438/109 |
| 2014/0363172 A1* | 12/2014 | Pelley | H04B 10/801 398/141 |
| 2015/0179285 A1* | 6/2015 | Kilmer | G11C 29/70 365/200 |
| 2015/0287653 A1* | 10/2015 | Pelley | H01L 22/22 257/777 |
| 2016/0049435 A1* | 2/2016 | Goel | H01L 27/14634 257/443 |
| 2017/0012031 A1* | 1/2017 | Lim | H01L 25/0657 |
| 2017/0062366 A1* | 3/2017 | Enquist | H01L 24/05 |

OTHER PUBLICATIONS

International Search Report and Written Opinion for International Application No. PCT/US2017/019519, dated May 31, 2017, 9 pages.

* cited by examiner

CORRECTION DIE FOR WAFER/DIE STACK

BACKGROUND

The demand for greater memory density within a limited footprint continues. While advances in technology shrink the size of memory devices, various applications and the consumer market shrink the area the memory devices may occupy, and limit the amount of power they may consume. One solution to this situation includes stacking memory device dies vertically. For example, the memory dies may be stacked one on top of another such that multiple dies occupy the area of a single die. Stacking dies can result in a higher memory bandwidth with a smaller form factor and less power use.

According to various techniques, including High Bandwidth Memory (HBM) and Hybrid Memory Cube (HMC) arrangements, 2, 4, or up to 8 dynamic random-access-memory (DRAM) dies may be vertically stacked, and may also include a memory controller as a base layer, for example. In the various methods, the stacked memory dies may be interconnected using through-silicon-vias (TSV), micro-bumps, or other interconnection/communication schemes. The three-dimensional stack of memory dies can take the place of a single memory die on a circuit board, for example.

However, there can be a variety of challenges to implementing these stacked memory arrangements. For example, some stacking techniques can be complex and/or costly. Additionally, even while using high-yield techniques, volume manufacturing processes generally cannot completely eliminate defects. A percentage of each batch of manufactured memory dies includes defective dies. A die (D2D) stack of memory dies containing at least one defective die constitutes a defective stack. If the defective stack is discarded as waste, then many of the discarded dies in the stack are not defective. Thus, discarding the defective stack can increase the quantity of individual good dies that are discarded as waste.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Representative implementations of devices and techniques provide an additional die in a wafer-to-wafer (W2W) stack or a die (D2D) stack. In various embodiments, the additional die comprises an extra die of the type of dies in the stack. For example, the dies in the stack may comprise dynamic random access memory (DRAM) dies (or other microelectronic elements), and the additional die may comprise an extra DRAM die (or like microelectronic element).

In various embodiments, a defective die may be identified during manufacturing testing or during post-manufacturing testing, for example. In an implementation, the additional die comprises a correction die and it is coupled to a die of the stack with the defective die. For example, the additional die may be coupled to a die of the respective stack using a surface mount technology (SMT), a direct bond interconnect (DBI) technique, or other technique. In the embodiments, the additional die electrically (e.g., functionally) replaces the defective die in the respective stack.

Optionally, an additional die can comprise a dummy die that can be coupled to die stacks of a wafer-to-wafer stack to adjust a height of the other stacks. For instance, if a correction die is coupled to one D2D stack, a dummy die may be coupled to neighboring D2D stacks to keep the overall height of the stacks even. In various embodiments, a dummy die may comprise an operational die, a non-operational die, filler (encapsulant) material, a portion of a reconstituted wafer, a blank carrier, or the like.

In some implementations, a correction wafer is coupled to a wafer of a W2W stack. In the implementations, the correction wafer includes one or more additional dies. The correction wafer may be aligned so that additional dies comprising correction dies are coupled to D2D stacks with a defective die in their respective stacks.

Various implementations and arrangements are discussed with reference to electrical and electronics components and varied carriers. While specific components (i.e., integrated circuit (IC) chip dies, wafers, substrates, printed circuit boards (PCB), memory storage devices, etc.) are mentioned, this is not intended to be limiting, and is for ease of discussion and illustrative convenience. The techniques and devices discussed are applicable to any type or number of packages, packaged circuits or components, circuits (e.g., integrated circuits (IC), mixed circuits, ASICS, memory devices, processors, etc.), electrical components (e.g., sensors, transistors, diodes, etc.), groups of components, carrier structures (e.g., wafers, substrates, panels, boards, PCBs, etc.), and the like. Each of these components, circuits, chips, structures, and the like, can be generically referred to as a "microelectronic element."

Figure 1:
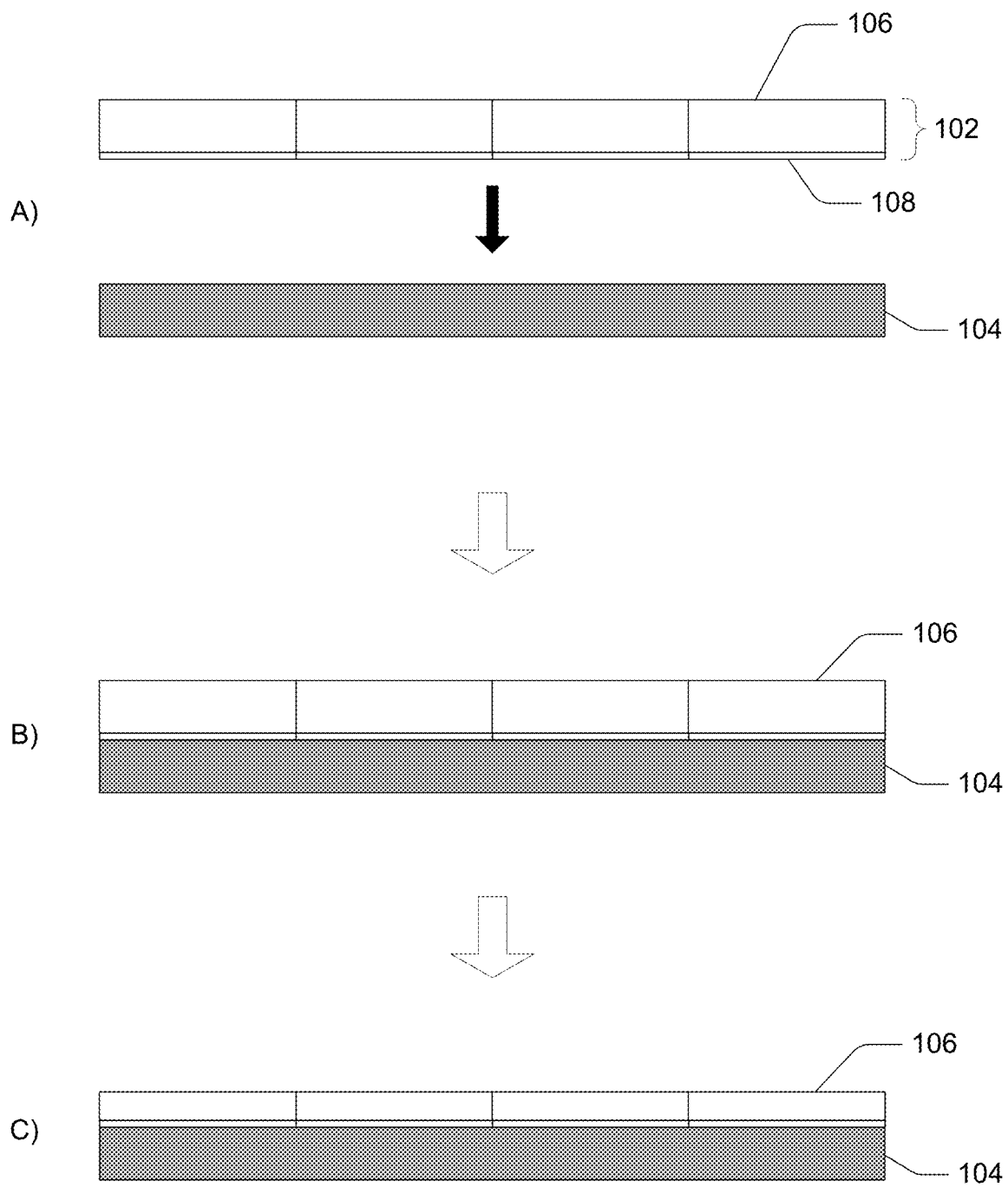
FIG. 1 illustrates an example of joining a wafer to a carrier, according to an implementation.

Implementations are explained in more detail below using a plurality of examples. Although various implementations and examples are discussed here and below, further implementations and examples may be possible by combining the features and elements of individual implementations and examples.

Example Wafer-to-Wafer and Die Stacks FIG. 1 illustrates an example of joining a wafer 102 to a carrier 104, according to an implementation. In the implementation, the wafer 102 is joined to the carrier 104 as a part of forming a wafer-to-wafer (W2W) stack. In various embodiments, the wafer 102 is a semiconductor wafer, which has been processed and/or manufactured to include various microelectronic elements formed as integrated chip (IC) dies 106, including electronic components, devices, circuits, systems, and so forth. For example, in an implementation, the dies 106 include dynamic random access memory (DRAM) storage devices, or the like.

As shown in FIG. 1, the wafer 102 is comprised of a plurality of dies 106. The illustration of a wafer 102 shown in FIG. 1 is not intended to be limiting, and in various embodiments, the wafer 102 may include few (less than 10) to very many (e.g., hundreds or thousands) of dies 106. In an implementation, each die 106 includes an interconnectivity layer 108. The layer 108 provides interconnectivity for each die 106, and may comprise surface mount technology (SMT) components, such as terminals, pads, a ball grid array (BGA), microbumps, wirebond connections, via terminations, and the like.

In another example, the layer 108 may comprise direct bond interconnect (DBI) components, such as a silicon oxide layer and copper pads. In such an embodiment, the silicon oxide layer can join with a like layer at room temperature and the copper pads can be heated to expand and fuse to other copper surfaces (or other conductive surfaces), for example. In an implementation, a nano-smooth connection results from the DBI technique.

In a further example, the layer 108 may comprise a redistribution layer (RDL), or like system for mapping connections from points on the electronic element of the die 106 to terminals, connection points, and the like, on a mating surface of the die 106.

As shown in FIG. 1, at (A) and (B), the wafer 102 is joined to the carrier 104 using SMT, DBI, or other coupling techniques. At (C), the wafer 102 may be planarized, or otherwise thinned (e.g., by grinding, blasting, etching, etc.) or their various combinations, etc.), for instance to reveal connection terminals, such as through silicon vias (TSV), or the like.

Figure 2:
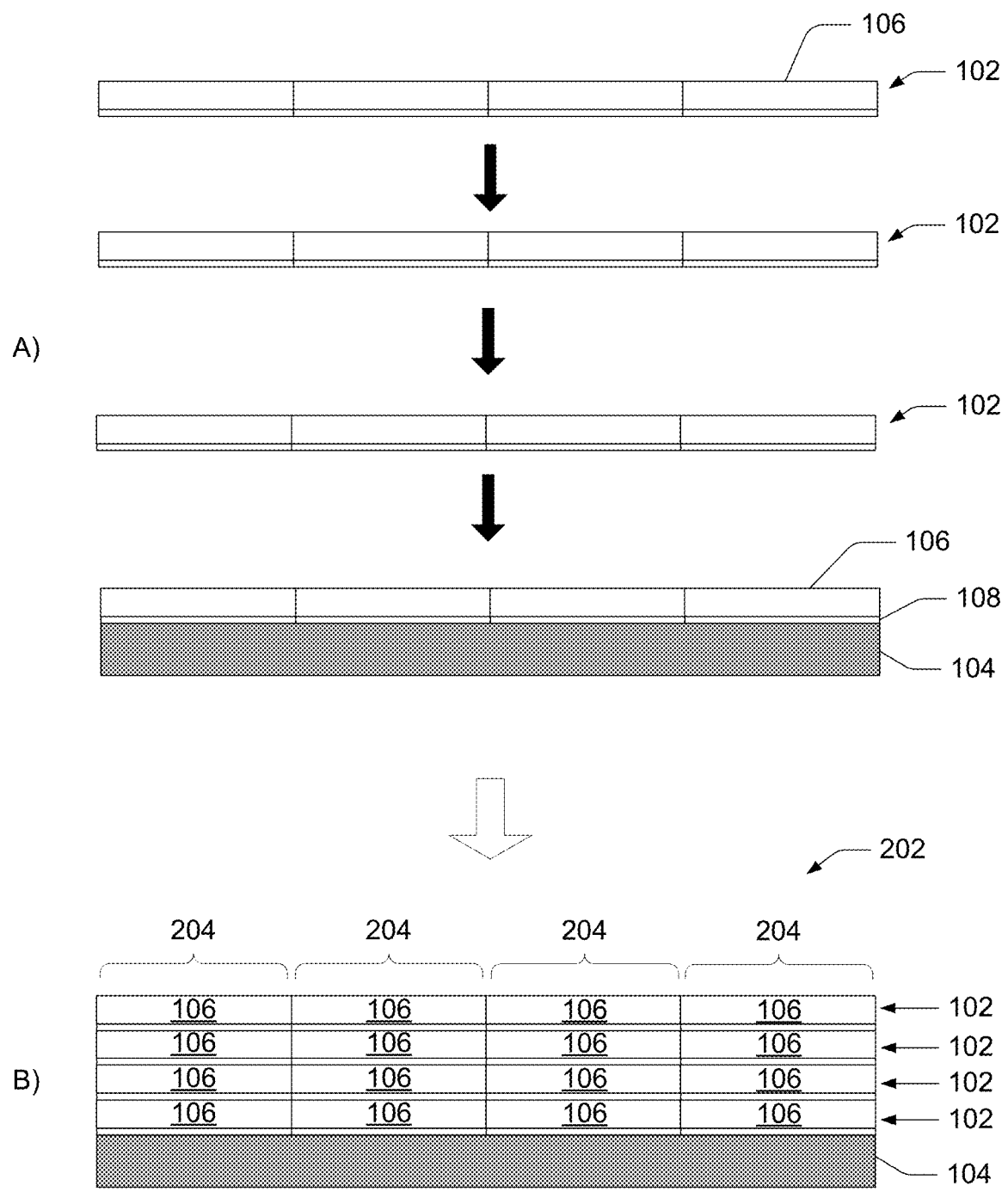
FIG. 2 illustrates an example of joining multiple wafers into a stack, according to an embodiment.

Referring to FIG. 2, as shown at (A), multiple wafers 102 are joined to the wafer 102/carrier 104 combination formed with reference to FIG. 1. The resulting W2W stack 202 is shown at (B). For example, the W2W stack 202 comprises a plurality of interconnected wafers 102 coupled together in a stack, one on top of another, and joined together via SMT, DBI, or other coupling technology.

In an embodiment, the wafers 102 of the W2W stack 202 are aligned such that the plurality of dies 106 of each wafer 102 couple to form a plurality of die (D2D) stacks 204. For example, each D2D stack 204 comprises a plurality of interconnected dies 106 coupled together in a stack, one on top of another, and joined together via SMT, DBI, or other coupling technology. In an implementation, each die stack 204 is aligned along an axis generally transverse to a plane of at least one of the wafers 102. In various implementations, the dies 106 in the D2D stacks 204 are interconnected and/or communicate with and/or through each other using TSVs, microbumps, or the like. In various embodiments, an even quantity of wafers is joined to form the W2W stack 202, likewise forming D2D stacks 204 with the same even quantity of stacked dies.

Example Additional Die

Figure 3:
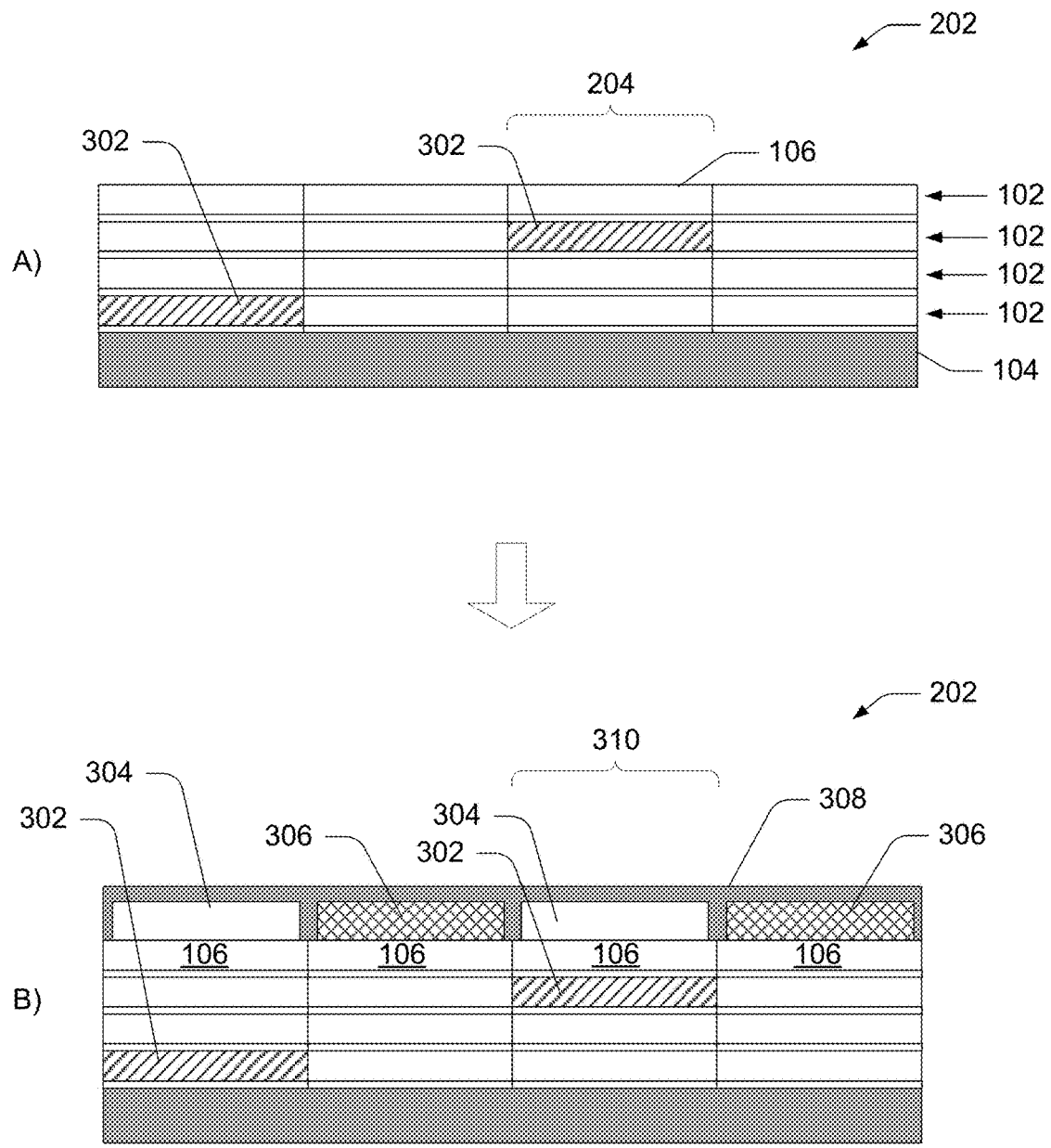
FIG. 3 illustrates an example of identifying non-operating dies and adding an additional die to a stack having a non-operating die, according to an embodiment.
Figure 4:
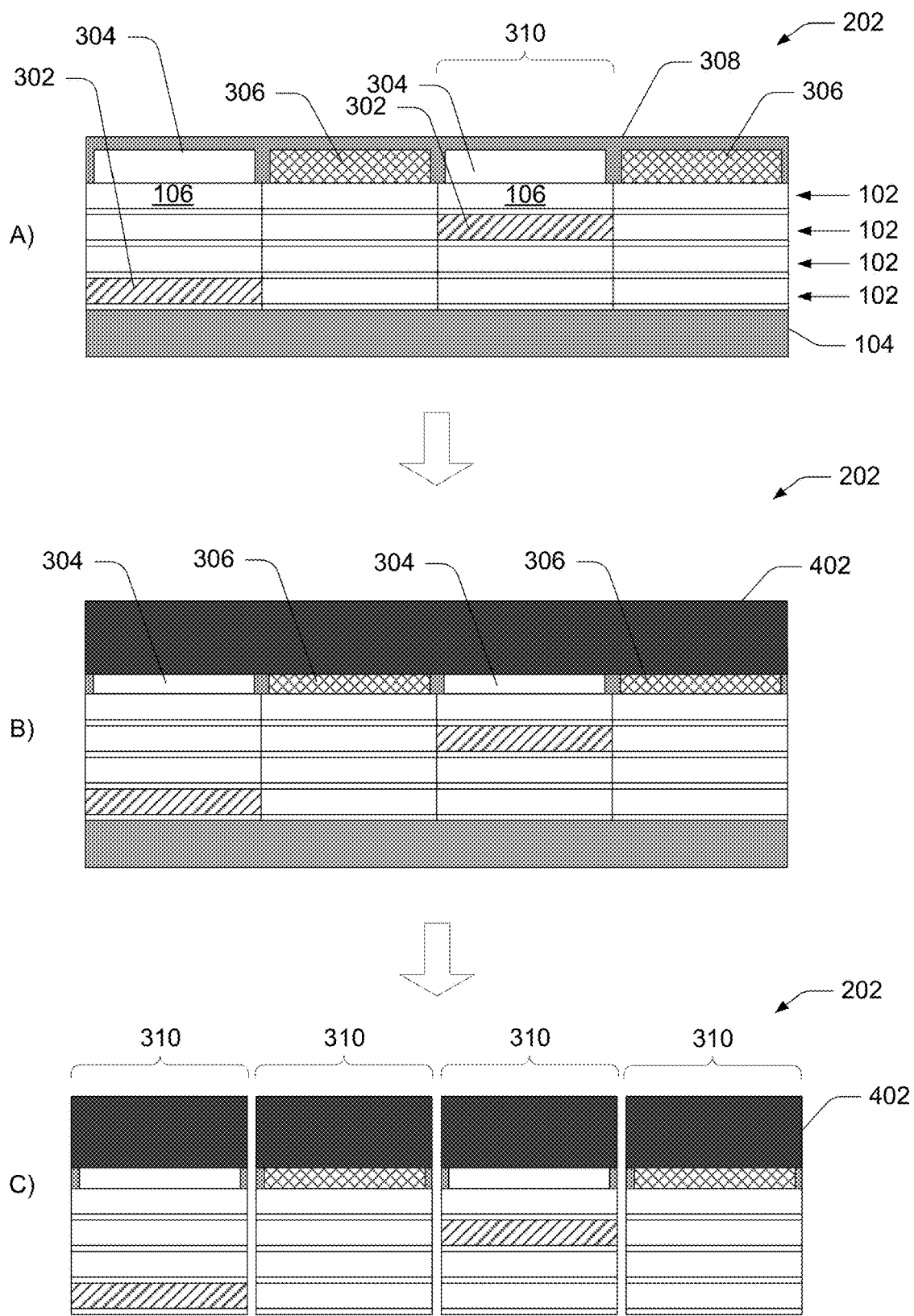
FIG. 4 illustrates an example of singulating a wafer stack into multiple die stacks, according to an embodiment.

In various implementations, as shown in FIGS. 3 and 4, a microelectronic assembly includes a plurality of semiconductor dies 106 coupled in a die stack 204, where a quantity of the dies 106 of the die stack 204 is preselected based on a desired capacity of the die stack 204. For example, four DRAM dies with a capacity of 1 gigabyte each may be preselected to be stacked in a D2D stack 204 to result in a desired 4 gigabyte memory storage assembly.

In various implementations, at least one of the dies 106 in the die stack 204 is a non-operating die, a die configured for non-use, or a die used only to electrically couple together two other dies in the die stack. In the implementations, as shown in FIG. 3 (b), an additional die (304 or 306) is coupled to a die 106 of the die stack 204 to form a modified stack 310 comprising the plurality of dies and the additional die (304 or 306). In an implementation, the modified stack 310 includes at least one non-operating die. In other words, the modified stack 310 includes the preselected quantity (e.g., 4, etc.) of operating dies (106, or 106 and 304) and one non-operating die (106, 302, or 306). In other words, in an embodiment, a quantity of the dies 106 of the die stack 204 is preselected to include at least one additional die 106 more than required for a predetermined capacity of the die stack 204. As in the above example, the quantity of dies 106 of the die stack 310 may comprise an odd-numbered quantity and an even number of dies 106 are utilized for a data memory function. For instance, the operating dies may comprise the dies 106 or a combination of the dies 106 and a correction die 304. Also, the non-operating die may comprise an extra die 106, a defective die 302, or a dummy die 306. In various examples, the additional die (304 or 306) may be added to the D2D stack 204, forming the modified stack 310, to correct for a defective die 302 of the D2D stack, to determine an overall height of the modified stack 310, to provide a redundant or backup die 106, or for various other purposes.

In various embodiments, the non-operating die comprises a known operational die 106, a known non-operational die (302, 306), a known defective die 302, a portion of a reconstituted wafer, or the like. In an example, when the non-operating die is disposed as the top-most die of the modified stack 310, the non-operating die comprises a dummy die 306. In another example, when the non-operating die is disposed between dies of the modified stack 310 or is disposed as the bottom-most die of the modified stack 310, the non-operating die comprises an inoperative die (i.e., defective die) 302.

In various examples, the preselected quantity of dies of the modified stack 310 comprises an even quantity. In the examples, the modified stack 310 includes the even quantity of operating dies (106, or 106 and 304) plus the non-operating die (106, 302, or 306). In other examples, the quantity of wafers of a wafer-to-wafer stack 202 comprises an even quantity, and each modified stack 310 of the wafer-to-wafer stack 202 includes the even quantity of operating dies (106, or 106 and 304) plus the non-operating die (106, 302, or 306).

In an implementation, a non-operating die (106, 302, or 306) passively couples at least one electrical signal between dies (106, 304) of the modified stack 310. The non-operating die (106, 302, or 306) is interconnected to the dies (106, 304) of the modified stack 310 as described above, and acts as a passive interconnect.

In an embodiment, the microelectronic assembly 204 can include more than one additional die (304 or 306). For instance, one or more additional dies (304 or 306) can be coupled to a die 106 of the D2D stack 204 or coupled to another additional die (304 or 306) to form the modified stack 310. In that case, the modified stack 310 includes two or more non-operating dies (106, 302, or 306).

Additional Die as Correction Die or Dummy Die

Referring to FIG. 3, the dies 106, the wafers 102, the W2W stacks 202, and/or the D2D stacks 204 may be tested during and/or after manufacture. One or more defective dies 302 may be revealed or identified during the testing. For example, as shown in FIG. 3 at (A), two defective dies 302 are identified, and in this example they are located in two of the four D2D stacks 204 illustrated.

In an implementation, as shown at FIG. 3 (B), a correction die 304 is coupled to a die 106 of a D2D stack 204 with a defective die 302. For example, in the illustration at (B), a correction die 304 is coupled to a die 106 in the first D2D stack 204 and another correction die 304 is coupled to a die 106 in the third D2D stack 204, since the first and third D2D stacks 204 contain defective dies 302. In various embodiments, the correction dies 304 are coupled to the dies 106 using SMT, DBI, or other coupling technologies.

In some embodiments, as shown in FIG. 3 (B), the correction die 304 is coupled to the top-most die 106 of a D2D stack 204 that has a defective die 302. In other embodiments, the correction die 304 may be coupled to another die 106 of the D2D stack 204. For example, the correction die 304 may be coupled to the bottom-most die 106, or another die 106 as desired.

In an implementation, a correction die 304 electrically substitutes (e.g., compensates) for a defective die 302 within the respective D2D stack 204. In other words, the correction die 304 operates as a functional equivalent replacement, and performs the entire electronic function of the non-functional defective die 302 in the D2D stack 204. Accordingly, the correction die 304 comprises a duplicate microelectronic element or a functionally equivalent microelectronic element as the defective die 302. For example, in the case where the dies 106 comprise DRAM devices, the correction dies 304 also comprise identical or equivalent DRAM devices.

In various embodiments, as also shown at FIG. 3 (B), one or more "dummy dies" 306 are coupled to dies 106 of other D2D stacks 204 without defective dies 302. For example, the dummy dies 306 can adjust an overall height of the other D2D stacks, to make them level with the D2D stacks 204 with correction dies 304. In the embodiments, the dummy dies 306 may comprise operational dies, non-operational dies, filler (encapsulant) material, a portion of a reconstituted wafer, or the like. Optionally, the W2W stack 202 may be covered (overmolded) with a filler material 308, such as silicon dioxide, or another high-k dielectric. In some cases, the filler material 308 may take the place of the dummy dies 306, when those positions are left blank, for example.

In various implementations, as shown in FIG. 4, the W2W stack 202 may include a carrier 402. For example, the carrier 402 may be added to the top of the W2W stack 202 for protection, processing, and/or handling of the W2W stack 202. In various embodiments, the carrier 402 comprises a "dummy wafer," similar to the dummy dies 306, which can be chosen to be thick enough to act as a carrier 402.

In another implementation, the W2W stack 202 may be singulated into individual D2D stacks 204, as shown in FIG. 4 (C). In the implementation, singulating the W2W stack 202 separates the D2D stacks 204 from each other and from the W2W stack 202. The individual D2D stacks 204 can then be prepared to be used with various applications. In an implementation, as shown at FIG. 4 (C), at singulation, the carrier layer 402 (if included) is also portioned, such that the carrier layer 402 is coupled to a die (e.g., a die 106, a defective die 302, a correction die 304, a dummy die 306, etc.) of the D2D stack 204. In the implementation, the carrier layer 402 can determine an overall height of the D2D stack 204. In the implementation, as shown at FIG. 4 (C), the underside carrier 104 may be removed prior to or after singulation of the W2W stack 202.

Figure 5:
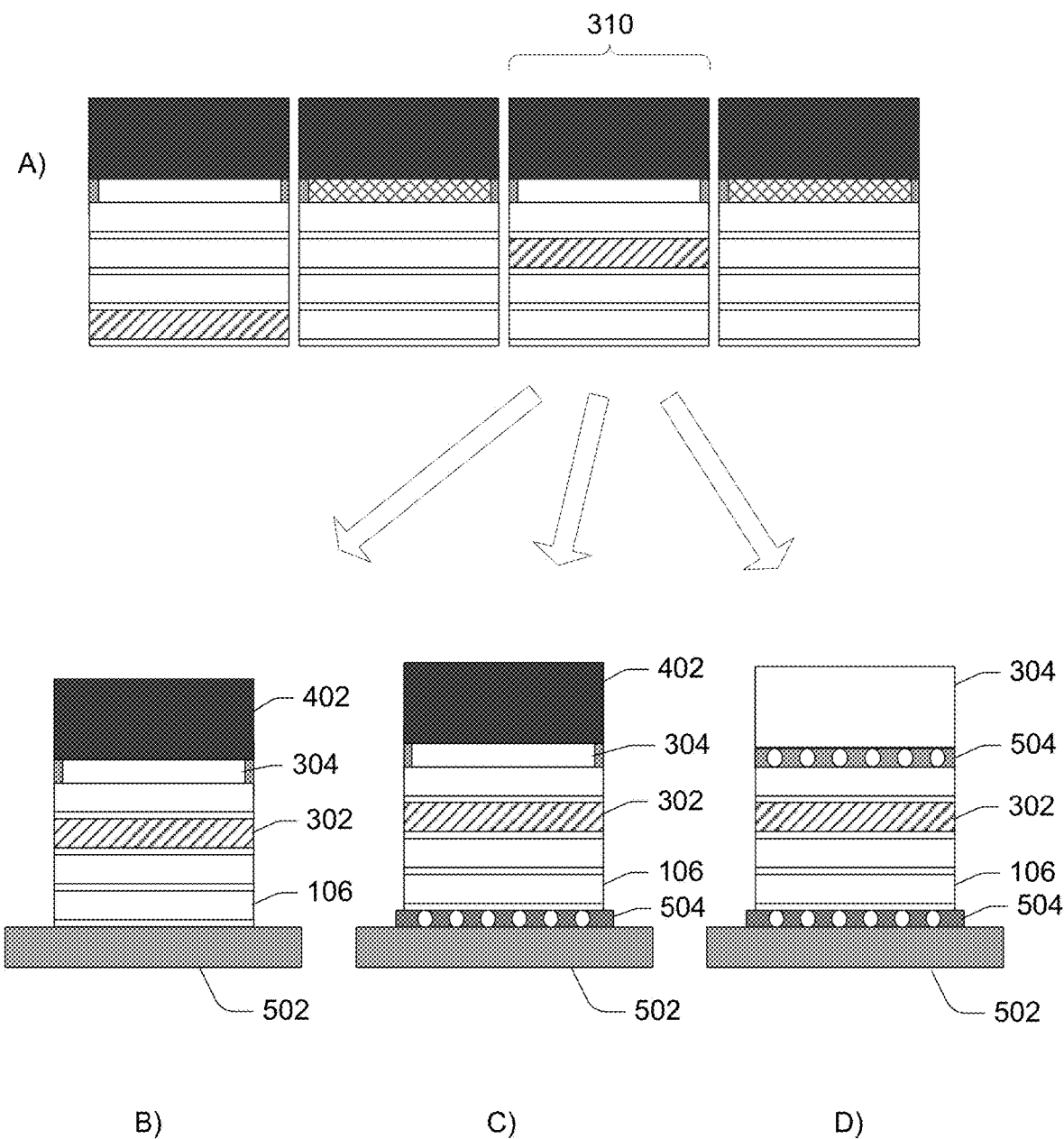
FIG. 5 illustrates some examples of mounting a die stack to a logic layer, according to various embodiments.

In an embodiment, as shown in FIG. 5, a D2D stack 204 can be mounted to a logic or control layer 502 for use in various applications. In some implementations, the logic layer 502 provides control for the microelectronic elements of the dies 106 in the D2D stack 204. For instance, in one implementation, the logic layer 502 provides control logic for memory storage components (e.g., DRAM, etc.) of the D2D stack 204.

In the implementations, the logic layer 502 is coupled to a die 106 of the D2D stack 204 using SMT, DBI, or other coupling techniques. For instance, FIG. 5 (B) shows an example of a logic layer 502 coupled to the bottom-most die 106 using a DBI technique, or the like. Surface mount technologies (SMT) 504, such as a ball grid array (BGA) are shown at (C) and (D) to couple the logic layer 502 to the bottom-most die 106 of a D2D stack 204. In alternative embodiments, the logic layer 502 may be coupled to another die 106 instead of the die 106 at the bottom of the D2D stack 204.

Referring again to FIG. 5, in an implementation, an additional die, such as a correction die 304 for example, may also be used in the place of the carrier layer 402 on a D2D stack 204. For example, as shown at (D), the additional die (e.g., correction die 304) may be preselected to have a thickness to determine an overall height of the D2D stack 204. In one example, a correction die 304 may be coupled to the top-most die 106 of the D2D stack 204. For instance, in the example shown at (D), the correction die 304 is coupled to the top-most die 106 using a SMT technology 504 (e.g., metallic bumps, BGA, etc.). In other embodiments, the correction die 304 may be coupled to the top-most die 106 using DBI, or another type of coupling technology.

Figure 6:
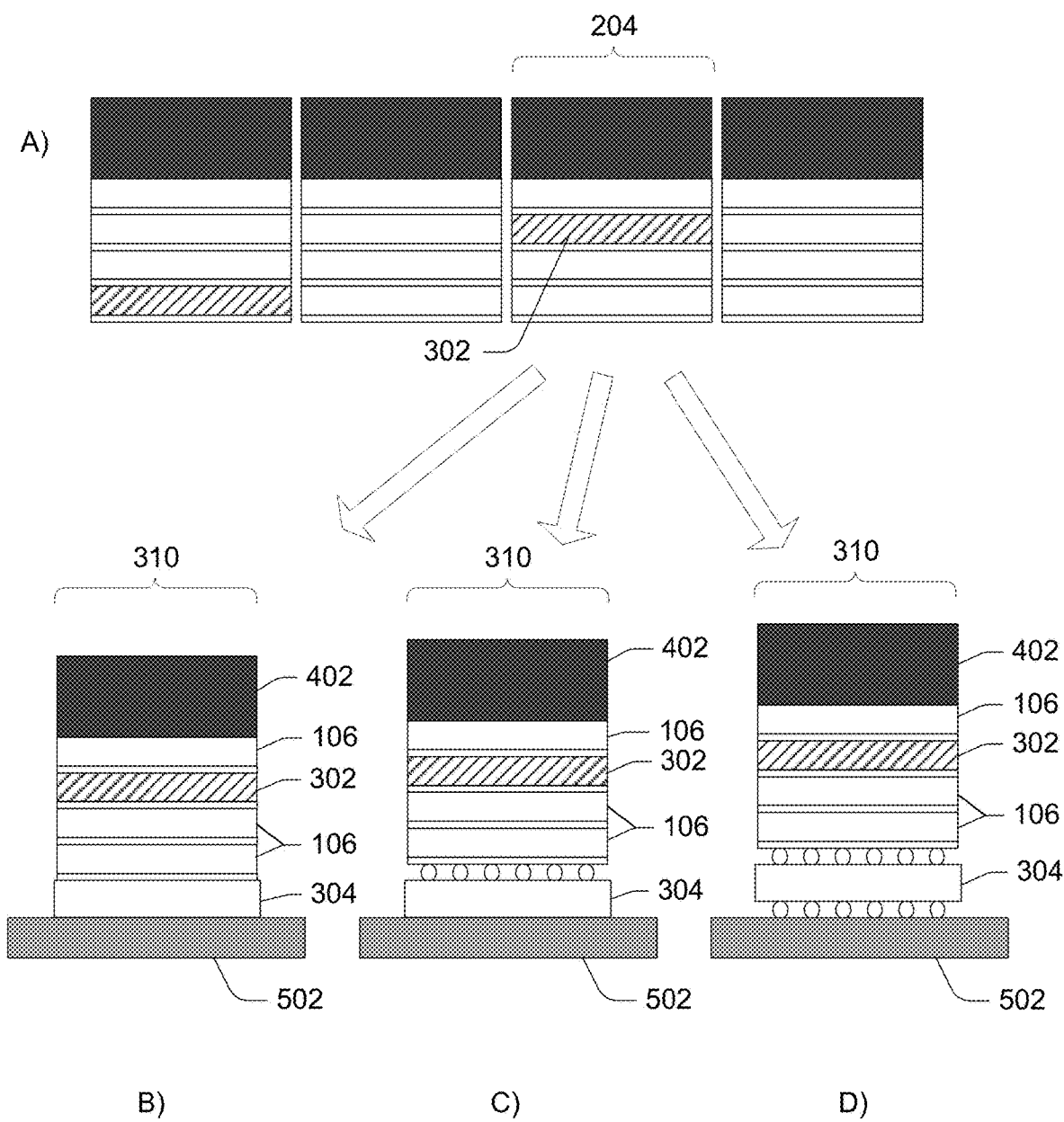
FIG. 6 illustrates some alternate locations for an additional die in a stack, according to various embodiments.

FIG. 6 illustrates some alternate locations for locating a correction die 304 in a D2D stack 204, according to various embodiments. For instance, the singulated D2D stack 204 shown at (A) includes a non-operating die (e.g., a defective die 302). At (B), (C), and (D) an additional die, such as a correction die 304 is coupled to the D2D stack 204, in various arrangements. At (B), the correction die 304 is shown coupled between the bottom-most die 106 and the logic layer 502 using a DBI technology, or the like. This creates a nano-smooth bond between the surfaces of the correction die 304 and the die 106 and logic layer 502. At (C), the correction die 304 is shown coupled to the bottom-most die 106 using a surface mount technology (SMT), such as bumping, for example. The correction die 304 is coupled to the logic layer 502 using a DBI technology, or the like. At (D), the correction die 304 is shown coupled between the bottom-most die 106 and the logic layer 502 using a SMT technology, such as bumping, or the like.

In alternate implementations, the additional die (e.g., correction die 304) may be coupled to a different die 106 than the bottom-most die 106 of the stack 204. Further, in some embodiments, the correction die 304 may be coupled to the defective die 302.

Figure 7:
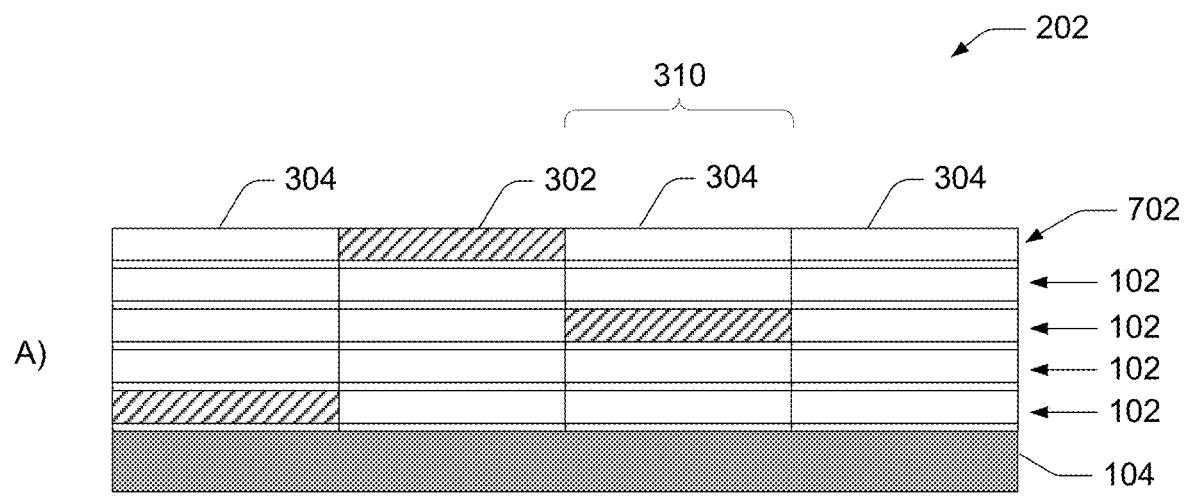
FIG. 7 illustrates an example of adding additional wafers to a wafer stack for correction of one or more defective dies, according to an embodiment.
Figure 7:
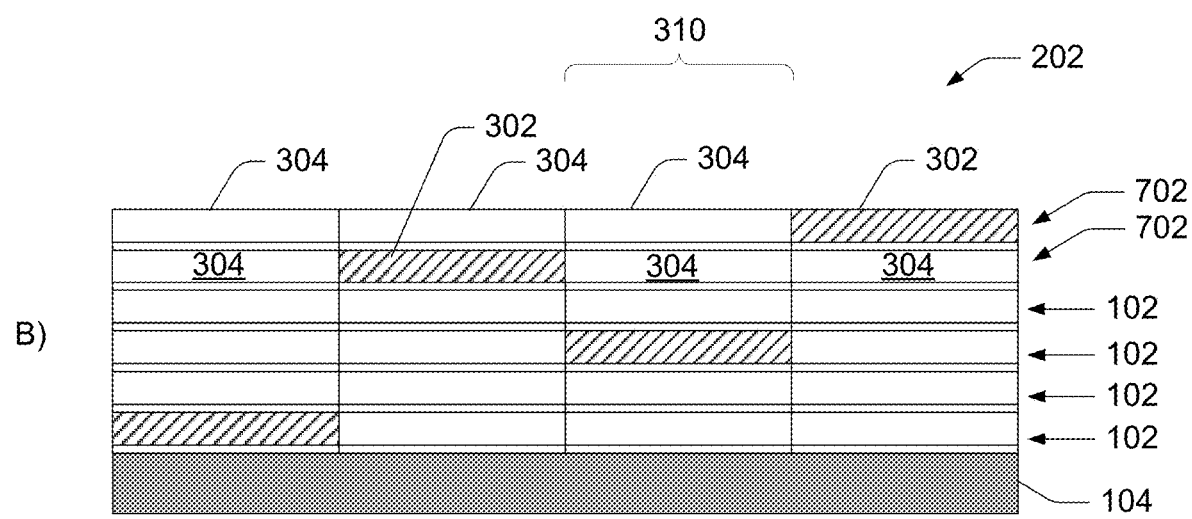

Referring to FIG. 7, in some implementations, additional dies, such as correction dies 304, dummy dies 306, and the like, may be added to D2D stacks 204 at the wafer-level. In other words, one or more correction wafers 702 (e.g., any quantity desired) may be added to a W2W stack 202 prior to singulation. For instance, FIG. 7 illustrates two W2W stacks 202 at (A) and (B). In the implementations, a correction wafer 702 is coupled to a wafer 102 of the W2W stack 202 (as shown at (A)), or coupled to a correction wafer 702 (as shown at (B)).

The correction wafer(s) 702 include one or more additional dies (such as correction dies 304 or dummy dies 306, for example), and the correction wafer(s) 702 are aligned such that the additional dies couple to dies (106, 302, 304) of the D2D stacks 204. For example, the correction wafers 702 can be aligned such that one or more correction dies 304 couple to dies (106, 302, 304) of the D2D stacks 204 that have defective dies 302 within the D2D stack 204. Additionally, the correction wafers 702 can be aligned such that one or more dummy dies 306 couple to dies (106, 302, 304) of the D2D stacks 204, as described above.

In the implementations, the correction wafers 702 and the additional dies (304, 306) are coupled using SMT, DBI, or other coupling technologies. Further, correction dies 304 of the correction wafers 702 electrically (e.g., functionally) substitute for the defective dies 302 in the D2D stacks 204 that have defective dies 302. In the implementations, a correction wafer 702 comprises an additional or extra wafer 102. In other words, the correction wafer 702 comprises an identical or equivalent wafer (based on the components of the wafer) to the wafers 102.

As shown in FIG. 7, a correction wafer 702 can also include one or more non-operational dies (106, 302, or 306). For instance, a correction wafer 702 can include defective dies 302. Thus, in some situations, it may be desirable to include two or more correction wafers 702 to a W2W stack 202. As mentioned above, the correction dies 304 of the correction wafers 702 are arranged and coupled to the D2D stacks 204 based on identifying the defective dies 302 within the stacks 204 (or the wafers 102). Redundant or non-operational correction dies 304 of a correction wafer 702 may function as a placeholder to determine stack height, a dummy die 306, or the like, unless/until needed to substitute for a defective die 302 in their respective D2D stack 204.

In various embodiments, a carrier layer 402 may be added to the top of the W2W stack 202, the underside carrier 104 may be removed from the bottom of the W2W stack 202, and the D2D stacks 204 may be singulated from the W2W stack 202 after coupling the correction wafer(s) 702. The singulated D2D stacks 204 may be processed as discussed above with respect to FIGS. 5 and 6.

The techniques, components, and devices described herein with respect to the correction dies 304 and correction wafers 702 are not limited to the illustrations in FIGS. 1-7, and may be applied to other designs, types, arrangements, and constructions including with other electrical components without departing from the scope of the disclosure. Unless otherwise specified, alternative components to those specifically mentioned may be used to implement the techniques described herein. Variations may have fewer elements than illustrated in the examples shown in FIG. 1 through FIG. 7, or they may have more or alternative elements than those shown.

As well as describing apparatuses, devices, structures, assemblies, arrangements, systems, and the like, FIGS. 1-7 and their respective discussions also illustrate example processes for remedying the occurrence of defective dies 106 in a multi-layer microelectronic assembly (such as a W2W stack 202 or a D2D stack 204, for example).

Example Process

Figure 8:
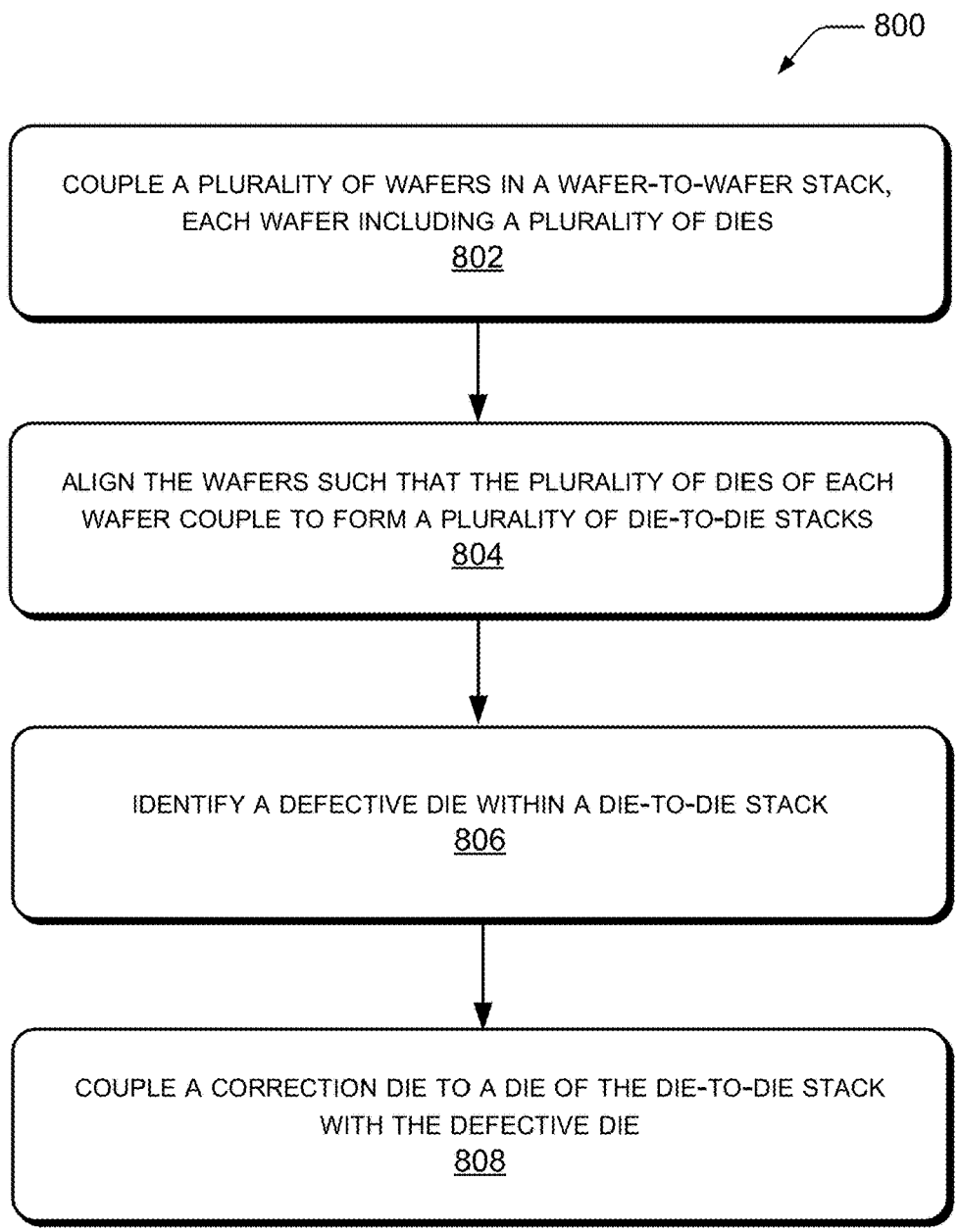
FIG. 8 is a flow diagram illustrating an example process for correcting for a defective die in a stack, according to an implementation.

FIG. 8 is a flow diagram illustrating an example process 800 for correcting for a defective die in a multi-layer microelectronic stack (such as W2W stack 202 or D2D stack 204, for example), according to various implementations. A correction die (such as correction die 304, for example) may be coupled to a die of the stack, electrically and functionally substituting for the defective die of the stack.

The order in which the processes are described herein is not intended to be construed as a limitation, and any number of the described process blocks can be combined in any order to implement the processes, or alternate processes. Additionally, individual blocks may be deleted from the processes without departing from the spirit and scope of the subject matter described herein. Furthermore, the processes can be implemented in any suitable materials, or combinations thereof, without departing from the scope of the subject matter described herein. In alternate implementations, other techniques may be included in the processes in various combinations, and remain within the scope of the disclosure.

At block 802, the process includes coupling a plurality of wafers (such as wafer 102, for example) in a wafer-to-wafer (W2W) stack (such as W2W stack 202, for example). In an implementation, the plurality of wafers may be coupled in the W2W stack via a surface mount technology (SMT) or a direct bond interconnect (DBI) technique.

In an implementation, each wafer includes a plurality of dies (such as die 106, for example). In an implementation, the plurality of dies comprises a plurality of memory storage devices, such as dynamic random access memory (DRAM) devices. In other implementations, the plurality of dies comprises other types of microelectronic elements.

At block 804, the process includes aligning the wafers such that the plurality of dies of each wafer couple to form a plurality of die (D2D) stacks (such as D2D stack 204, for example). In an implementation, the plurality of dies may be coupled in the D2D stack via SMT, DBI, or another technique.

At block 806, the process includes identifying a defective die within a D2D stack. In various implementations, the defective die may be identified during manufacturing testing, quality control testing, or the like.

At block 808, the process includes coupling a correction die to a die of the D2D stack with the defective die. In various embodiments, the correction die may be coupled to the die of the D2D stack using SMT (such as with microbumps, for example), DBI, or other die coupling techniques. Further, the correction die may be coupled to any die of the D2D stack.

In an implementation, the process includes electrically substituting the correction die for the defective die of the D2D stack. The correction die may interconnect and communicate with other dies of the D2D stack using through-silicon vias (TSV), microbumps, or the like. The correction die electrically and functionally replaces the defective die in the D2D stack.

In an implementation, the process includes coupling one or more dummy dies to dies of one or more other D2D stacks without a defective die. In an embodiment, the one or more dummy dies adjust an overall height of the one or more other D2D stacks without a defective die. For example, the dummy dies may even out the height of the various D2D stacks, compensating for D2D stacks with correction dies.

In an implementation, the process includes coupling one or more correction wafers to a wafer of the W2W stack. In other words, correction dies are added to the D2D stacks at the wafer level. In the implementation, the one or more correction wafers include one or more correction dies. For example, the process includes aligning the one or more correction wafers such that the one or more correction dies couple to dies of one or more D2D stacks with defective dies.

In an implementation, the process includes coupling a carrier layer to a wafer of the W2W stack, to a dummy die, and/or to the correction die. In an embodiment, a thickness of a correction die or a dummy die may be preselected to determine an overall height of the D2D stack. In such embodiments, the correction die or the dummy die may function as a carrier layer in a D2D stack, and may also be disposed as the top-most layer of the D2D stack.

In an implementation, the process includes singulating the D2D stack, including the correction die, from the W2W stack. In another implementation, the process includes coupling the D2D stack including the correction die to a logic layer comprised of one or more control components. In the implementation, the logic layer provides control for the microelectronic components (such as memory devices) of the dies.

In alternate implementations, other techniques may be included in the process in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. A microelectronic assembly, comprising: a plurality of semiconductor dies coupled in a plurality of vertical three dimensional (3D) die stacks via a direct bond interconnect technique that includes direct insulator-to-insulator bonding at room-temperature, such that a footprint of each die stack is equivalent to a footprint of a single die of the die stack, a quantity of the dies of each die stack preselected to include at least one additional die more than required for a predetermined capacity of the die stack, at least one of the dies in at least one of the die stacks of the plurality of die stacks being a non-operating die, a die configured for non-use, or a die used only to electrically couple together two other dies in the die stack, and at least one die of each die stack having a non-operating die comprises a correction die, wherein the correction die comprises a functionally duplicate or functionally equivalent die to the non-operating die and operates as a functional equivalent replacement for the non-operating die in the stack, and wherein the correction die has a footprint that is smaller than a footprint of the non-operating die, wherein a die stack without a non-operating die does not include a correction die, and wherein each die of the die stack includes an interconnectivity layer comprising one or more electrical connections within a perimeter of the die, each die of the die stack electrically coupled to an adjacent die of the die stack using the one or more electrical connections and one or more mated electrical connections within a perimeter of a facing surface of the adjacent die.

2. The microelectronic assembly of claim 1, wherein the quantity of dies of the die stack comprises an odd-numbered quantity and an even number of dies are utilized for data memory function.

3. The microelectronic assembly of claim 1, wherein the at least one die configured for non-use comprises a dummy die.

4. The microelectronic assembly of claim 3, wherein the dummy die is disposed as the top-most die in the die stack.

5. The microelectronic assembly of claim 1, wherein when the non-operating die is disposed between dies of the die stack or is disposed as the bottom-most die of the die stack, the non-operating die comprising an inoperative die.

6. The microelectronic assembly of claim 1, wherein the non-operating die comprises a known operational die, a known non-operational die, a known defective die, or a portion of a reconstituted wafer.

7. The microelectronic assembly of claim 1, wherein the correction die performs the entire electronic function of the non-operating die.

8. A microelectronic arrangement, comprising: a plurality of semiconductor wafers coupled in a wafer-to-wafer stack via a direct bond interconnect technique that includes direct insulator-to-insulator bonding at room-temperature, each wafer including a plurality of dies, the wafers aligned such that the plurality of dies of each wafer couple to form a plurality of die stacks, each die stack aligned along an axis generally transverse to a plane of at least one of the wafers, wherein one or more of the plurality of die stacks of the plurality of wafers includes a non-operating die; one or more correction dies coupled to a die of each of the one or more die stacks that includes the non-operating die to form one or more modified stacks, the one or more correction dies are not coupled to the die stack without the non-operating die, wherein the correction die comprises a functionally duplicate or functionally equivalent die to the non-operating die and operates as a functional equivalent replacement for the non-operating die in the die stack.

9. The microelectronic arrangement of claim 8, wherein the quantity of wafers of the wafer-to-wafer stack comprises an even quantity, and wherein each modified stack of the wafer-to-wafer stack includes the even quantity of operating dies plus the non-operating die.

10. The microelectronic arrangement of claim 8, wherein the correction die is arranged to electrically substitute for a defective die of the one or more of the plurality of die stacks.

11. The microelectronic arrangement of claim 8, wherein at least one of the plurality of die stacks includes a dummy die coupled to a die of the at least one of the die stacks, the dummy die adjusting an overall height of a respective modified stack.

12. The microelectronic arrangement of claim 11, wherein the dummy die comprises an operational die, a non-operational die, filler material, or a portion of a reconstituted wafer.

13. The microelectronic arrangement of claim 8, wherein the plurality of die stacks, including the one or more correction dies, are singulated from the wafer-to-wafer stack.

14. The microelectronic arrangement of claim 8, further comprising one or more correction wafers coupled to a wafer of the wafer-to-wafer stack via the direct bond interconnect technique, the one or more correction wafers including the one or more correction dies, the one or more correction wafers are aligned to the wafer of the wafer-to-wafer stack such that the one or more correction dies are coupled to dies of the one or more die stacks that include a non-operating die and are not coupled to dies of a die stack that does not include a non-operating die.

* * * * *